(12) United States Patent
Nishio

(10) Patent No.: US 12,477,648 B2
(45) Date of Patent: Nov. 18, 2025

(54) MULTILAYER SUBSTRATE AND METHOD FOR MANUFACTURING MULTILAYER SUBSTRATE

(71) Applicant: Murata Manufacturing Co., Ltd., Nagaokakyo (JP)

(72) Inventor: Kosuke Nishio, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 168 days.

(21) Appl. No.: 18/196,523

(22) Filed: May 12, 2023

(65) Prior Publication Data

US 2023/0284381 A1    Sep. 7, 2023

Related U.S. Application Data

(63) Continuation of application No. PCT/JP2021/041721, filed on Nov. 12, 2021.

(30) Foreign Application Priority Data

Nov. 30, 2020  (JP) ................................. 2020-198383

(51) Int. Cl.
    *H05K 1/02*    (2006.01)

(52) U.S. Cl.
    CPC ......... *H05K 1/0219* (2013.01); *H05K 1/0224* (2013.01); *H05K 1/0277* (2013.01); *H05K 1/0298* (2013.01); *H05K 2201/0129* (2013.01); *H05K 2201/0141* (2013.01)

(58) Field of Classification Search
    CPC .. H05K 1/0298; H05K 1/0277; H05K 1/0313; H05K 3/0017; H05K 3/46; H05K 2201/0129; H05K 2201/0141; H05K 2203/06; H05K 1/028; H05K 1/024; H05K 3/002; H05K 1/0225; H05K 2201/0715;
    (Continued)

(56) References Cited

U.S. PATENT DOCUMENTS 3,679,500 A * 7/1972 Kubo et al. ............. H01J 29/81
                                                         216/100
3,971,661 A * 7/1976 Lindberg ............. H05K 3/4076
                                                         430/312
(Continued)

FOREIGN PATENT DOCUMENTS

JP  2005191903 A  7/2005
WO  2015005029 A1  1/2015

OTHER PUBLICATIONS

English Translation JP2003204129; Hayashi et al.; Fujitsu LTD; Published Sep. 18, 2003 (Year: 2003).*

(Continued)

*Primary Examiner* — Steven T Sawyer
(74) *Attorney, Agent, or Firm* — Keating & Bennett, LLP

(57) ABSTRACT

A multilayer substrate includes laminated insulating layers each including a main surface on which a conductor is provided. The multilayer substrate also includes a signal line defined by the conductors, and a shield conductor defined by the conductors. The shield conductor includes an opening and a portion overlapping the signal line in plan view. At least one of the insulating layers includes a void that communicates with the opening and that is larger than the opening in plan view.

9 Claims, 8 Drawing Sheets

(58) Field of Classification Search
CPC .. H05K 1/0219; H05K 1/0222; H05K 1/0224; H05K 1/0227; H05K 1/0216
See application file for complete search history.

(56) References Cited

U.S. PATENT DOCUMENTS

| | | | | |
|---|---|---|---|---|
| 5,526,950 | A * | 6/1996 | Tago | H01J 29/076 |
| | | | | 216/41 |
| 6,449,839 | B1 * | 9/2002 | Glovatsky | H05K 3/4084 |
| | | | | 29/831 |
| 2005/0110138 | A1 | 5/2005 | Dutta | |
| 2016/0037622 | A1 * | 2/2016 | Shinagawa | H05K 1/0313 |
| | | | | 174/254 |
| 2023/0232529 | A1 * | 7/2023 | Heo | H01B 7/18 |
| | | | | 174/254 |

OTHER PUBLICATIONS

International Search Report in PCT/JP2021/041721, mailed Feb. 8, 2022, 3 pages.
Written Opinion in PCT/JP2021/041721, mailed Feb. 8, 2022, 3 pages.

* cited by examiner

MULTILAYER SUBSTRATE AND METHOD FOR MANUFACTURING MULTILAYER SUBSTRATE

CROSS REFERENCE TO RELATED APPLICATIONS

This application claims the benefit of priority to Japanese Patent Application No. 2020-198383 filed on Nov. 30, 2020 and is a Continuation Application of PCT Application No. PCT/JP2021/041721 filed on Nov. 12, 2021. The entire contents of each application are hereby incorporated herein by reference.

BACKGROUND OF THE INVENTION

1. Field of the Invention

The present invention relates to a multilayer substrate including a plurality of insulating layers that are laminated and to a method for manufacturing the multilayer substrate.

2. Description of the Related Art

There has been known a multilayer substrate formed by a plurality of overlapping insulating layers on which conductors are patterned (see, for example, International Publication No. 2015/005029). In the multilayer substrate of International Publication No. 2015/005029, portions of a surface ground conductor that do not overlap signal lines in plan view are removed, and an insulating layer has recesses or holes.

The multilayer substrate of International Publication No. 2015/005029 is a resin multilayer substrate capable of improving flexibility without degrading the electrical characteristics of a transmission line.

SUMMARY OF THE INVENTION

Preferred embodiments of the present invention provide multilayer substrates each having improved electrical characteristics of a transmission line, and methods for manufacturing such multilayer substrates.

A multilayer substrate according to a preferred embodiment of the present invention includes a laminated substrate including a plurality of laminated insulating layers, and a conductor provided on a main surface of at least some of the plurality of insulating layers. The multilayer substrate includes a signal line defined by the conductor, and a shield conductor defined by the conductor, the shield conductor including a portion overlapping the signal line in plan view. The shield conductor includes an opening. At least one of the plurality of insulating layers includes a void that communicates with the opening and that is larger than the opening in the plan view.

In this manner, a multilayer substrate according to a preferred embodiment of the present invention includes a void in a portion overlapping the shield conductor in the plan view, thus enabling reductions in dielectric constant and dielectric loss while reducing or preventing a reduction in shielding performance. As a result, it is possible to improve the electrical characteristics of a transmission line.

Preferred embodiments of the present invention each improve the electrical characteristics of a transmission line.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
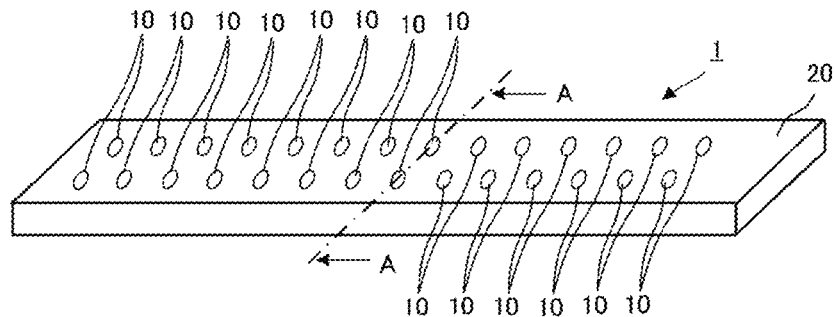
FIG. 1 is a perspective view of a multilayer substrate 1 according to a preferred embodiment of the present invention.
Figure 2:
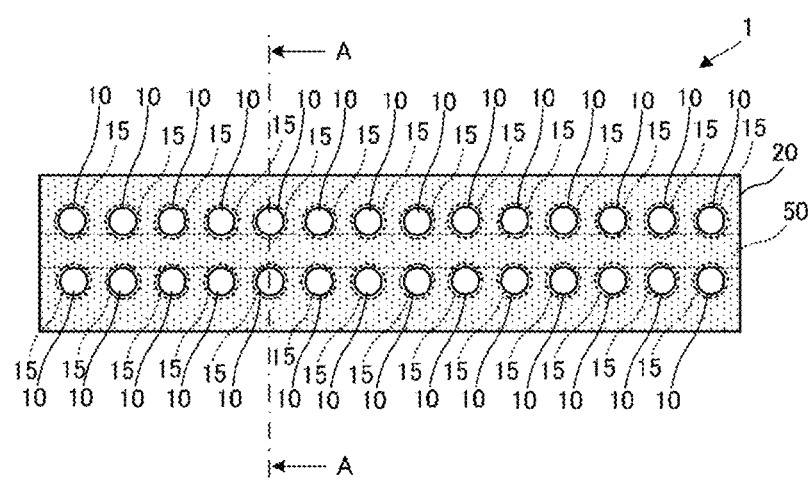
FIG. 2 is a plan view of the multilayer substrate 1.
Figure 3:
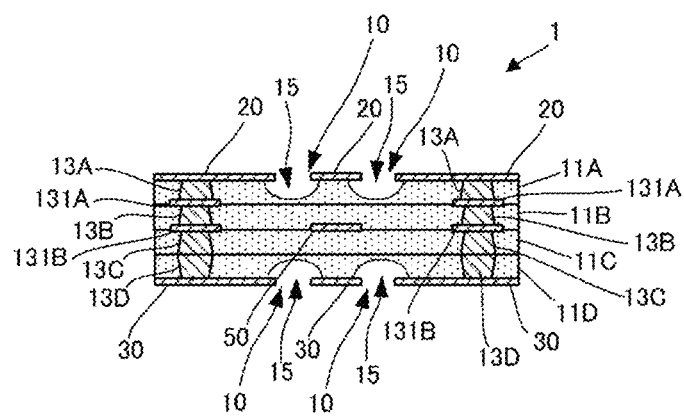
FIG. 3 is a side sectional view of the multilayer substrate 1 taken along A-A in FIG. 2.

A multilayer substrate 1 according to a preferred embodiment of the present invention will be described below. FIG. 1 is a perspective view of the multilayer substrate 1. FIG. 2 is a plan view of the multilayer substrate 1. FIG. 3 is a side sectional view of the multilayer substrate 1 taken along A-A in FIG. 2.

As illustrated in FIG. 1, the multilayer substrate 1 has a cuboid shape longer in one direction. The multilayer substrate 1 includes, for example, a mounting terminal (not illustrated).

The multilayer substrate 1 is formed by laminating a resin base material 11A, a resin base material 11B, a resin base material 11C, and a resin base material 11D in this order from the upper surface side of the multilayer substrate 1. The resin base material 11A, the resin base material 11B, the resin base material 11C, and the resin base material 11D are examples of an insulating layer. The number of insulating layers laminated is not limited to the number of insulating layers laminated illustrated in the present preferred embodiment.

The resin base material 11A, the resin base material 11B, the resin base material 11C, and the resin base material 11D are made of the same kind of thermoplastic resin. Examples of the thermoplastic resin include a liquid crystal polymer resin. Examples of the thermoplastic resin other than the liquid crystal polymer resin include polyetheretherketone (PEEK), polyetherimide (PEI), polyphenylene sulfide (PPS), and polyimide (PI), and these may be used, instead of the liquid crystal polymer resin. The material for the insulating layers is not limited to the thermoplastic resin, and, for example, ceramic can be used as the material for the insulating layers.

A conductor (for example, copper) is provided on an upper surface or a lower surface of each resin base material. For example, a conductor pattern 20 is provided on the upper surface of the resin base material 11A. A conductor pattern 131A is provided on the upper surface of the resin base material 11B. A conductor pattern 50 and a conductor pattern 131B are provided on the upper surface of the resin base material 11C. A conductor pattern 30 is provided on the lower surface of the resin base material 11D. Each conductor pattern is provided before lamination.

The conductor pattern 20 and the conductor pattern 30 are at a reference potential (ground potential) and define and function as shield conductors. The conductor pattern 50 defines functions as a signal line. The conductor pattern 20 covers an upper surface of the multilayer substrate 1. The conductor pattern 30 covers a lower surface of the multilayer substrate 1. The conductor pattern 50 has a rectangular or substantially rectangular shape longer in the longer axis direction of the multilayer substrate 1 in plan view. However, the configuration of the signal line and the shield conductors is not limited to the configuration illustrated in the present preferred embodiment. It is sufficient that the present invention at least includes a signal line and shield conductors each including a portion overlapping the signal line in plan view.

Interlayer connection conductors 13A are provided in the resin base material 11A. The conductor pattern 20 and the conductor pattern 131A are electrically connected by the interlayer connection conductors 13A. Interlayer connection conductors 13B are provided in the resin base material 11B. The conductor pattern 131A and the conductor pattern 131B are electrically connected by the interlayer connection conductors 13B. Interlayer connection conductors 13C are provided in the resin base material 11C. Interlayer connection conductors 13D are provided in the resin base material 11D. The interlayer connection conductors 13C and the respective interlayer connection conductors 13D overlap each other in plan view (when viewed in the lamination direction) and are directly in contact with each other with no conductor pattern interposed therebetween. The conductor pattern 131B and the conductor pattern 30 are electrically connected by the interlayer connection conductors 13C and the interlayer connection conductors 13D.

The conductor pattern 20 and the conductor pattern 30 include openings 10. The openings 10 have a circular or substantially circular shape in plan view. The diameter of the opening 10 is smaller than the width of the conductor pattern 30. Since the diameter of the opening 10 is smaller than the width of the conductor pattern 30, it is possible to reduce noise emission. A plurality of the openings 10 are provided at a uniform pitch with a portion of the conductor pattern 30 interposed therebetween in the width direction in plan view. In the example in FIG. 2, the pitch at which the openings 10 are provided is about twice the diameter of the opening 10. However, for example, the number, shape, size, and pitch of the openings 10 are not limited to the examples of the present preferred embodiment. In addition, all of the openings 10 do not have to be the same or substantially the same in shape and size.

Voids 15 are provided at respective positions in the resin base material 11A that overlap the openings 10 in plan view. Similarly, the voids 15 are provided at respective positions in the resin base material 11D that overlap the openings 10 in plan view. The voids 15 are formed by, for example, etching the resin base material 11A and the resin base material 11D through the openings 10. In addition to portions directly under the openings 10, portions directly under the conductor pattern 20 and the conductor pattern 30 are removed from the resin base material 11A and the resin base material 11D by isotropic etching. Thus, the voids 15 communicate with the respective openings 10. The diameter of the void 15 is larger than the diameter of the opening 10 in plan view. For example, the distance between the interlayer connection conductor 13A (interlayer connection conductor 13D) and the opening 10 is preferably equal to or larger than the diameter of the opening 10.

Portions directly under the conductor pattern 20 and the conductor pattern 30, which are shield conductors, are removed from the respective insulating layers. The portions where the portions of the insulating layers are removed are reduced in dielectric constant and dielectric loss compared with the portions where portions of the insulating layers are not removed. On the other hand, the portions where the portions of the insulating layers are removed are located directly under the conductor pattern 20 and the conductor pattern 30 and are thus not reduced in shielding performance. Thus, the multilayer substrate 1 of the present preferred embodiment is capable of reducing or preventing a reduction in shielding performance, of being reduced in dielectric constant and dielectric loss, and of improving the electrical characteristics of a transmission line.

Figure 4:
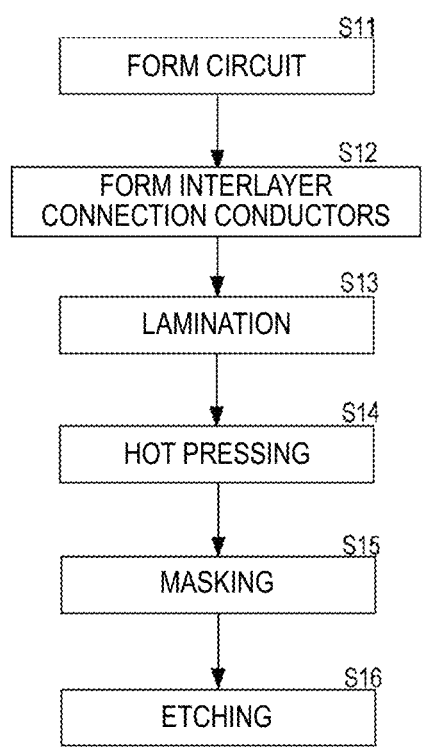
FIG. 4 is a flowchart illustrating a method for manufacturing the multilayer substrate 1 according to a preferred embodiment of the present invention.

FIG. 4 is a flowchart illustrating a non-limiting example of a method for manufacturing a multilayer substrate according to a preferred embodiment of the present invention. First, a circuit forming step (S11) of preparing resin base materials, which are insulating layers, and forming conductor patterns to form a circuit is performed in the example method for manufacturing the multilayer substrate.

The resin base materials are each prepared by cutting a portion having a required area from a resin sheet including one main surface on which a metal (for example, copper foil) is adhered throughout in advance. Copper foil is patterned on the resin base materials 11 to form the conductor patterns. For example, photolithography or screen printing is used as a patterning technique. The openings 10 are formed at the time of forming the conductor pattern 20 and the conductor pattern 30. However, the openings 10 may be formed after, for example, lamination or hot pressing of the resin base materials.

Next, through holes passing through the resin base materials in the lamination direction are formed by, for example, laser processing, and conductive paste is filled into the through holes to form interlayer connection conductors (S12). The conductive paste is made of a conductive material mainly including, for example, tin and copper.

Next, the insulating layers (the resin base material 11A, the resin base material 11B, the resin base material 11C, and the resin base material 11D) are laminated (S13). Subsequently, the insulating layers are, for example, hot pressed by a hot press (S14) to form the multilayer substrate 1.

Subsequently, portions where insulating layers are exposed other than the openings 10, such as a terminal (not illustrated), are masked (S15), and the multilayer substrate 1 is etched to form the voids 15 (S16).

Figure 5A:
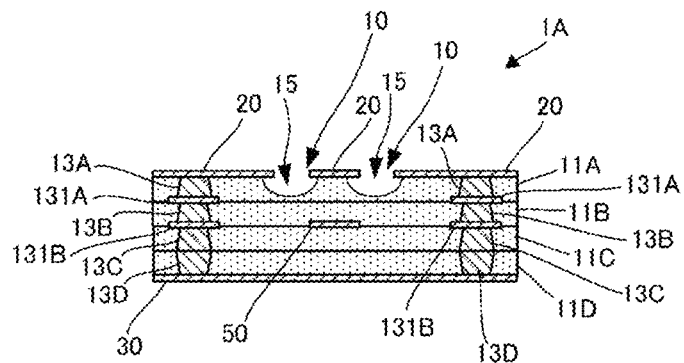
FIG. 5A is a sectional view of a multilayer substrate 1A according to a first modified example of a preferred embodiment of the present invention.

The openings 10 and the voids 15 do not have to be provided in both main surfaces of the multilayer substrate 1. FIG. 5A is a sectional view of a multilayer substrate 1A according to a first modified example of a preferred embodiment of the present invention. Common components in FIGS. 3 and 5A have the same reference signs and will not be described. In the example in FIG. 5A, the openings 10 and the voids 15 are provided only in the main surface at the conductor pattern 20. Alternatively, the openings 10 and the voids 15 may be provided only in the main surface at the conductor pattern 30.

Figure 5B:
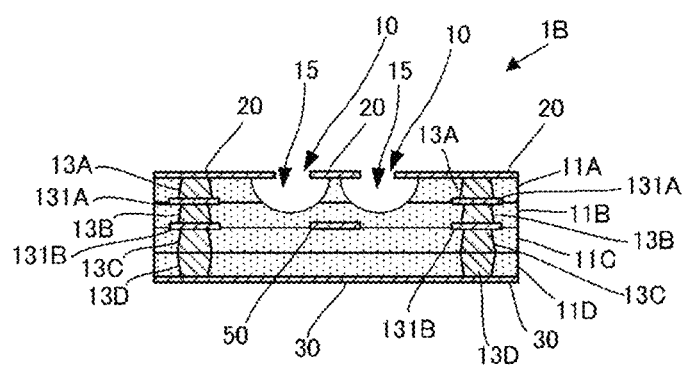
FIG. 5B is a sectional view of a multilayer substrate 1B according to a second modified example of a preferred embodiment of the present invention.

FIG. 5B is a sectional view of a multilayer substrate 1B according to a second modified example of a preferred embodiment of the present invention. Common components in FIGS. 3 and 5B have the same reference signs and will not be described. The voids 15 of the multilayer substrate 1B according to the second modified example are provided so as to extend to the insides of a plurality of insulating layers. For example, in the example in FIG. 5B, the voids 15 are provided so as to extend to the insides of the resin base material 11A and the resin base material 11B. In this manner, the voids 15 may be provided so as to extend to the insides of a plurality of insulating layers.

Figure 6:
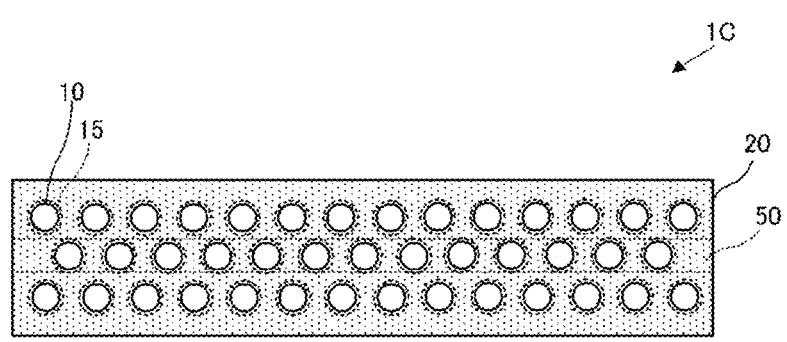
FIG. 6 is a plan view of a multilayer substrate 1C according to a third modified example of a preferred embodiment of the present invention.

FIG. 6 is a plan view of a multilayer substrate 1C according to a third modified example of a preferred embodiment of the present invention. As illustrated in FIG. 6, the openings 10 may overlap the conductor pattern 50, which is a signal line, in plan view. In this case, the area of the conductor pattern 50 that overlaps the voids 15 in plan view is large, thus enabling further reductions in dielectric constant and dielectric loss. On the other hand, the voids 15 do not have to overlap the conductor pattern 50 in plan view. The position of an electric field generated at the conductor pattern 50 and a shield conductor is not limited to a position where the conductor pattern 50 and the shield conductor overlap each other. Thus, even when the voids 15 do not overlap the conductor pattern 50 in plan view, the voids 15 are capable of reducing the dielectric constant and the dielectric loss as long as being provided in the vicinity of the conductor pattern 50. As a result, it is possible to improve the electrical characteristics of a transmission line.

Figure 7A:
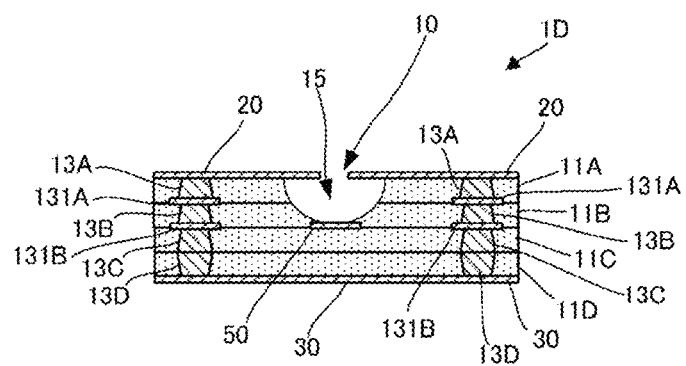
FIG. 7A is a sectional view of a multilayer substrate 1D according to a fourth modified example of a preferred embodiment of the present invention.

FIG. 7A is a sectional view of a multilayer substrate 1D according to a fourth modified example of a preferred embodiment of the present invention. Common components in FIGS. 3 and 7A have the same reference signs and will not be described. The opening 10 of the multilayer substrate 1D according to the fourth modified example overlaps the conductor pattern 50 in plan view. In addition, the void 15 extends to the conductor pattern 50. That is, the opening 10 and the conductor pattern 50 communicate with each other via the void 15. This case enables further reductions in dielectric constant and dielectric loss.

Figure 7B:
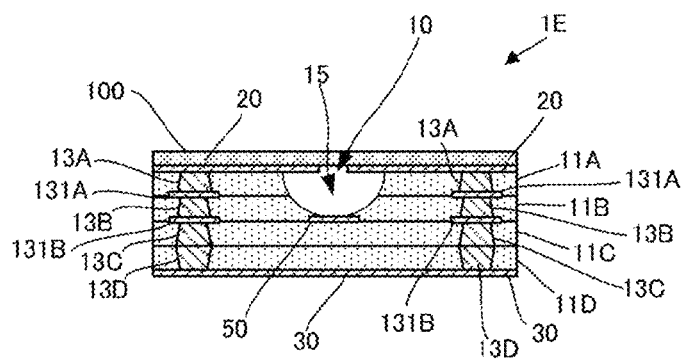
FIG. 7B is a sectional view of a multilayer substrate 1E according to a fifth modified example of a preferred embodiment of the present invention.

FIG. 7B is a sectional view of a multilayer substrate 1E according to a fifth modified example of a preferred embodiment of the present invention. The multilayer substrate 1E differs from the multilayer substrate 1D in that the main surface of the multilayer substrate 1E at the conductor pattern 20 is covered with a cover layer 100. The cover layer 100 is made of, for example, polyethylene terephthalate (PET). The conductor pattern 50 is not exposed to the outside due to the cover layer 100. Even when the multilayer substrate 1E is covered with the cover layer 100, the void 15 is maintained. Thus, similarly to the multilayer substrate 1D, the multilayer substrate 1E is capable of being further reduced in dielectric constant and dielectric loss.

Figure 8A:
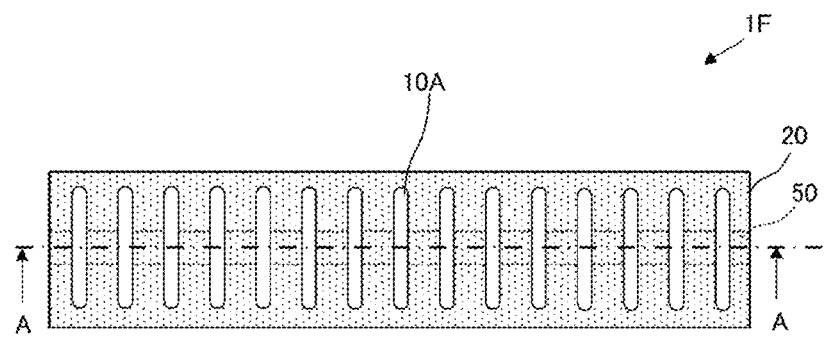
FIGS. 8A to 8C are plan views illustrating modified examples of an opening shape.
Figure 8B:
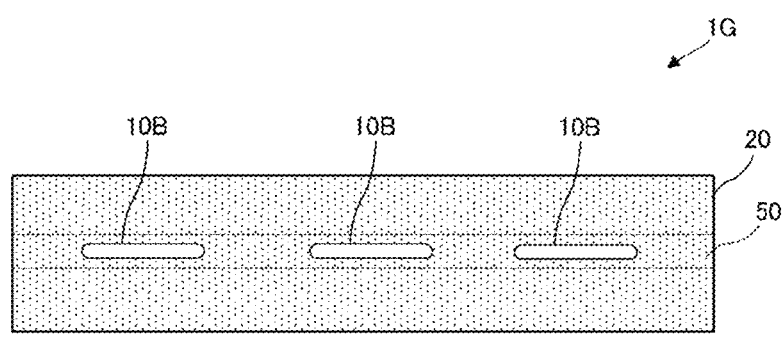
Figure 8C:
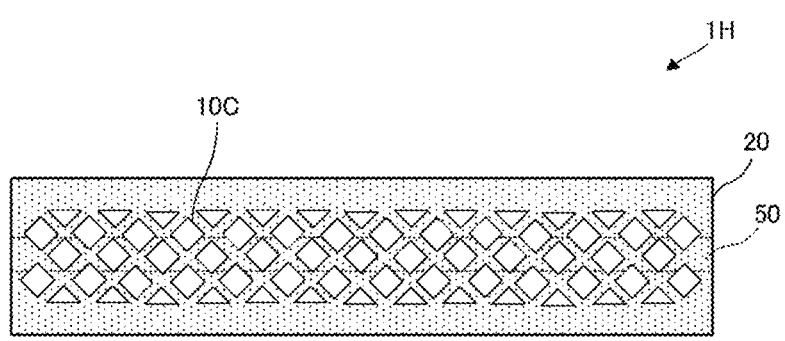

Next, FIGS. 8A to 8C are plan views illustrating modified examples of an opening shape. As described above, for example, the number, shape, size, and pitch of the openings are not limited to the examples illustrated in the plan view of FIG. 2. As illustrated in FIG. 8A, the openings may be openings 10A, which are longer in the width direction of a multilayer substrate 1F. As illustrated in FIG. 8B, the openings may be openings 10B, which are longer in the long side direction of a multilayer substrate 1G. In addition, as in a multilayer substrate 1H illustrated in FIG. 8C, the openings may be openings 10C, which are formed by removing portions of the conductor pattern 20 so as to define a mesh pattern.

Figure 9:
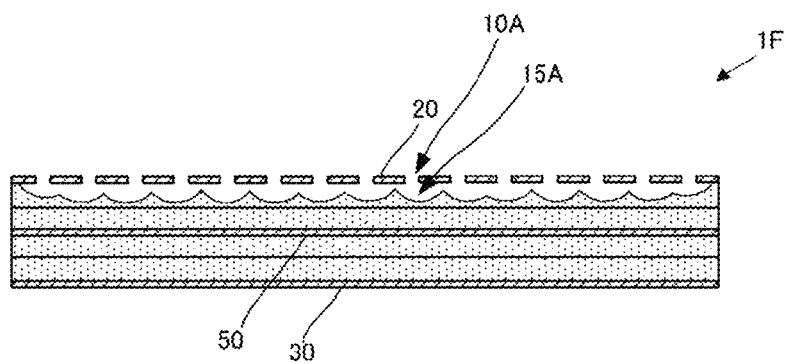
FIG. 9 is a side sectional view of a multilayer substrate 1F according to a preferred embodiment of the present invention taken along A-A in FIG. 8A.

FIG. 9 is a side sectional view of the multilayer substrate 1F taken along A-A in FIG. 8A. As illustrated in FIG. 9, when a plurality of openings are disposed close to each other, voids communicating with the respective openings may be connected. The example in FIG. 9 illustrates a void 15A, which is provided by connecting a plurality of voids communicating with a plurality of the respective openings 10A. In this manner, a shield conductor may be separated from an insulating layer in sectional view. For example, the pitch between the openings 10A is preferably smaller than the depth of the void 15A. In this manner, the opening ratio of the conductor (pitch between the openings 10A) is reduced, and the void 15A is expanded. Thus, it is possible to maintain a sufficient electric field at the void 15A and to achieve a desired effect (improvement in electrical characteristics).

Figure 10:
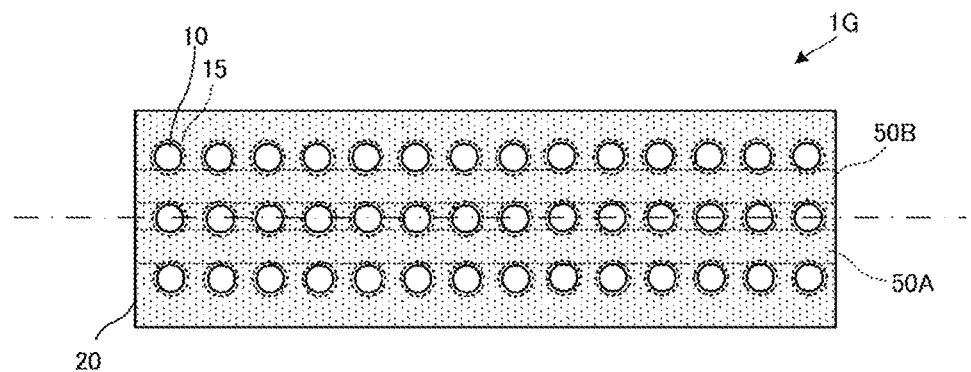
FIG. 10 is a plan view of a multilayer substrate 1G according to a preferred embodiment of the present invention including a conductor pattern 50A and a conductor pattern 50B.

FIG. 10 is a plan view of a multilayer substrate 1G according to a preferred embodiment of the present invention including a conductor pattern 50A and a conductor pattern 50B. The conductor pattern 50A and the conductor pattern 50B define differential transmission lines. As illustrated in FIG. 10, the openings 10 are symmetrically disposed so as to be arranged in the width direction of the multilayer substrate 1G with a symmetry axis of the differential transmission lines interposed therebetween, and the voids 15 are symmetrically disposed so as to be arranged in the width direction of the multilayer substrate 1G with the symmetry axis of the differential transmission lines interposed therebetween. Thus, the multilayer substrate 1G is capable of maintaining the symmetry of the electrical characteristics of the conductor pattern 50A and the conductor pattern 50B and of improving the characteristics of the transmission lines.

Figure 11A:
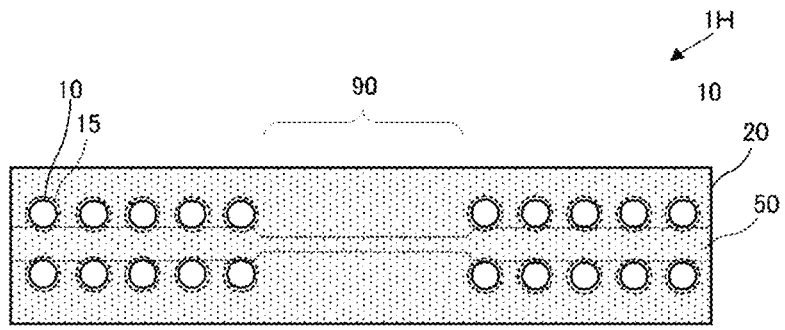
FIG. 11A is a plan view of a multilayer substrate 1H according to a preferred embodiment of the present invention including a bending region 90.
Figure 11B:
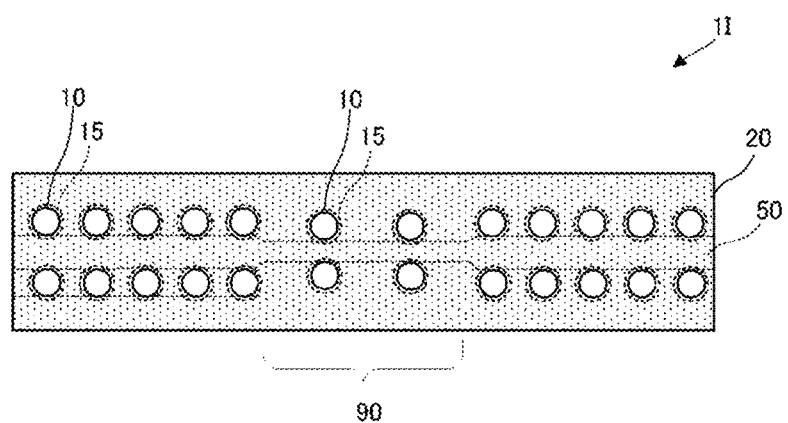
FIG. 11B is a plan view of a multilayer substrate 1I having the bending region 90.
Figure 11C:
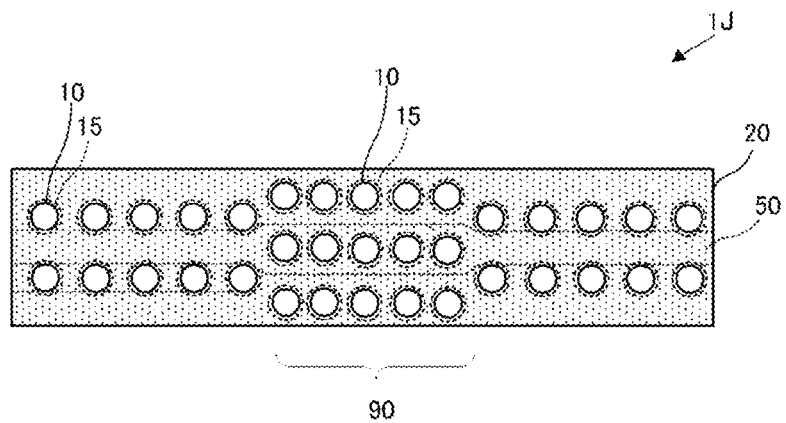
FIG. 11C is a plan view of a multilayer substrate 1J according to a preferred embodiment of the present invention including the bending region 90.

FIG. 11A is a plan view of a multilayer substrate 1H according to a preferred embodiment of the present invention including a bending region 90. FIG. 11B is a plan view of a multilayer substrate 11 according to a preferred embodiment of the present invention including the bending region 90. FIG. 11C is a plan view of a multilayer substrate 1J according to a preferred embodiment of the present invention including the bending region 90.

The multilayer substrate 1H in FIG. 11A includes the bending region 90 at the center or approximate center thereof in the longer axis direction. The openings 10 and the voids 15 are not provided in the bending region 90. Thus, when the bending region 90 is bent in the lamination direction, no breaking of the shield conductor of the multilayer substrate 1H starts from the openings 10. Since the openings 10 and the voids 15 are not provided in the bending region 90, the bending region 90 has a dielectric constant and a dielectric loss larger than those of a region other than the bending region 90. However, the width of the conductor pattern 50 is smaller in the bending region 90. Thus, the conductor pattern 50 is uniform in impedance.

The multilayer substrate 1I in FIG. 11B also includes the bending region 90 at the center or approximate center thereof in the longer axis direction. The openings 10 and the voids 15 are provided in the bending region 90. However, the pitches between the openings 10 and between the voids 15 in the bending region 90 are larger than the pitches therebetween in a different region. Accordingly, the opening ratio of the openings 10 and the voids 15 in the bending region 90 is smaller than the opening ratio of the openings 10 and the voids 15 in a different region. Thus, when the bending region 90 is bent in the lamination direction, breaking of the shield conductor of the multilayer substrate 1I is less likely to start from the openings 10. In addition, since the opening ratio of the openings 10 and the voids 15 in the bending region 90 is smaller than the opening ratio of the openings 10 and the voids 15 in a different region, the bending region 90 has a dielectric constant and a dielectric loss larger than those of a region other than the bending region 90. However, the width of the conductor pattern 50 is smaller in the bending region 90. Thus, the conductor pattern 50 is uniform in impedance.

As illustrated in FIGS. 11A and 11B, a case in which the opening ratio of the openings 10 and the voids 15 in the bending region 90 is smaller than the opening ratio of the openings 10 and the voids 15 in a different region enables a reduction of breaking of the shield conductor starting from the openings 10 when the bending region 90 is bent in the lamination direction. Thus, in particular, such a configuration is preferable for a shield conductor having a high elastic modulus.

The multilayer substrate 1J in FIG. 11B also includes the bending region 90 at the center or approximate center thereof in the longer axis direction. The openings 10 and the voids 15 are provided in the bending region 90. However, the opening ratio of the openings 10 and the voids 15 in the bending region 90 is larger than the opening ratio of the openings 10 and the voids 15 in a different region. Specifically, the pitches between the openings 10 and between the voids 15 in the bending region 90 illustrated in FIG. 11B are about one and a half times the pitches therebetween in a different region. In addition, each of the number of the openings 10 and the number of the voids 15 arranged in the width direction in the bending region 90 is, for example, three.

Thus, the bending region 90 of the multilayer substrate 1J is easier to bend than a different region. Since the opening ratio of the openings 10 and the voids 15 in the bending region 90 is larger than the opening ratio of the openings 10 and the voids 15 in a different region, the bending region 90 has a dielectric constant and a dielectric loss smaller than those of a region other than the bending region 90. However, the width of the conductor pattern 50 is larger in the bending region 90. Thus, the conductor pattern 50 is uniform in impedance.

As illustrated in FIG. 11C, when the opening ratio of the openings 10 and the voids 15 in the bending region 90 is larger than the opening ratio of the openings 10 and the voids 15 in a different region, the bending region 90 is easy to bend in the lamination direction. Thus, in particular, such a configuration is preferable for an insulating layer having a high elastic modulus.

Figure 12:
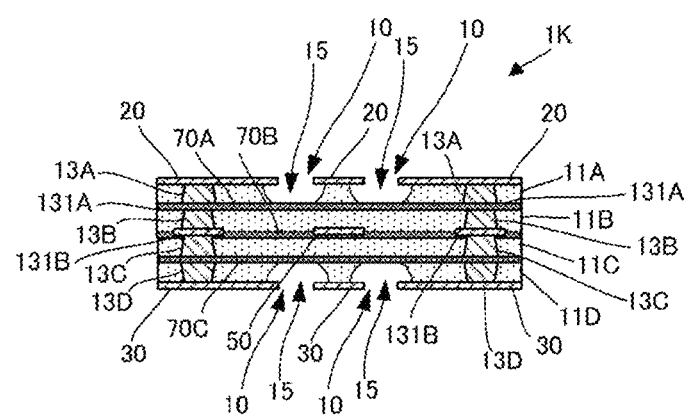
FIG. 12 is a sectional view of a multilayer substrate 1K according to a preferred embodiment of the present invention including an adhesive layer 70A, an adhesive layer 70B, and an adhesive layer 70C.

FIG. 12 is a sectional view of a multilayer substrate 1K according to a preferred embodiment of the present invention including an adhesive layer 70A, an adhesive layer 70B, and an adhesive layer 70C. The multilayer substrate 1K is formed by laminating the resin base material 11A, the resin base material 11B, the resin base material 11C, and the resin base material 11D via the adhesive layers. The adhesive layers are made of a material whose etching rate is lower than that of the resin base material 11A to the resin base material 11D and are made of, for example, polytetrafluoroethylene (PTFE). The resin base material 11A and the resin base material 11B adhere to each other with the adhesive layer 70A. The resin base material 11B and the resin base material 11C adhere to each other with the adhesive layer 70B. The resin base material 11C and the resin base material 11D adhere to each other with the adhesive layer 70C.

The voids 15 are formed by etching the resin base material 11A and the resin base material 11D through the openings 10. However, the etching rate of the adhesive layers is lower than that of the resin base material 11A and the resin base material 11D. Accordingly, the etching stops at an upper surface of the adhesive layer 70A and a lower surface of the adhesive layer 70C. Thus, it is possible to control the depth of the void 15.

It is to be understood that the description of the present preferred embodiment is illustrative in all respects and is not restrictive. The scope of the present invention is not defined by the above-described preferred embodiments but is defined by the claims. Furthermore, it is intended that the scope of the present invention includes all modifications within meanings and scopes equivalent to the claims.

For example, preferably, the interlayer connection conductors are not exposed to the voids 15. The configuration in which the interlayer connection conductors are not exposed to the voids 15 enables electrical characteristics to be reduced or prevented from being degraded due to oxidation of the conductors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a laminated substrate including a plurality of laminated insulating layers, and a plurality of conductors each provided on a main surface of at least some of the plurality of insulating layers;
   a signal line defined by one of the plurality of conductors; and
   a shield conductor defined by another one of the plurality of conductors, the shield conductor including a portion overlapping the signal line in plan view; wherein
   the shield conductor includes an opening;
   at least one of the plurality of insulating layers includes a void that communicates with the opening and that is larger than the opening in plan view; and
   at least a portion of the laminated insulating layers is located between the signal line and the portion of the shield conductor overlapping the signal line in a lamination direction; and a portion of the void overlaps the signal line and the shield conductor in the lamination direction.

2. The multilayer substrate according to claim 1, wherein the void extends to insides of the plurality of insulating layers.

3. The multilayer substrate according to claim 1, wherein
the multilayer substrate includes a bending region; and
the bending region and a region other than the bending region include different opening ratios.

4. The multilayer substrate according to claim 1, wherein the opening and the signal line communicate with each other via the void.

5. The multilayer substrate according to claim 1, further comprising a cover layer on an outermost layer of the multilayer substrate, the cover layer covering the opening.

6. The multilayer substrate according to claim 1, wherein each of the plurality of insulating layers is made of a liquid crystal polymer resin.

7. The multilayer substrate according to claim 1, wherein each of the plurality of insulating layers is made of thermoplastic resin.

8. The multilayer substrate according to claim 1, wherein each of the plurality of insulating layers is made of polyetheretherketone, polyetherimide, polyphenylene sulfide, or polyimide.

9. The multilayer substrate according to claim 1, wherein the opening has a circular or substantially circular shape.

* * * * *